United States Patent
Boerstler (10) Patent No.: US 7,016,448 B2
(45) Date of Patent: Mar. 21, 2006

(54) SYNCHRONIZATION STATE DETECTOR

(75) Inventor: David William Boerstler, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 791 days.

(21) Appl. No.: 09/820,512

(22) Filed: Mar. 29, 2001

(65) Prior Publication Data

US 2002/0172312 A1    Nov. 21, 2002

(51) Int. Cl.
*H04L 7/00* (2006.01)
(52) U.S. Cl. .................. 375/373; 375/518; 327/144
(58) Field of Classification Search ............... 375/326, 375/327, 371, 373, 376; 370/516, 518; 327/144, 327/146, 147
See application file for complete search history.

(56) References Cited

U.S. PATENT DOCUMENTS

| | | | | |
|---|---|---|---|---|
| 5,127,023 A | * | 6/1992 | Tash et al. ................. | 375/282 |
| 5,509,037 A | * | 4/1996 | Buckner et al. ............ | 375/371 |
| 5,850,422 A | * | 12/1998 | Chen ......................... | 375/371 |
| 5,887,040 A | * | 3/1999 | Jung et al. ................. | 375/372 |
| 6,107,946 A | | 8/2000 | Jeong ......................... | 341/101 |
| 6,211,741 B1 | * | 4/2001 | Dalmia ....................... | 331/11 |
| 6,266,799 B1 | * | 7/2001 | Lee et al. .................... | 716/6 |
| 6,331,999 B1 | * | 12/2001 | Ducaroir et al. ............ | 375/226 |

OTHER PUBLICATIONS

"Transceiver with 2x-Oversampling and Transmit Signal Pre-Emphasis," *IEEE International Solid-State Circuits Conference*, 1997, pp. 238-239, 464.
"CMOS Transceiver for Serial Data Communication," *IEEE International Solid-State Circuits Conference*, 1997, pp. 242-243, 465.
"CMOS Transceiver for Serial Data Communication," *IEEE International Solid-State Circuits Conference*, 1995, pp. 32-33, 336.

* cited by examiner

*Primary Examiner*—Young T. Tse
(74) *Attorney, Agent, or Firm*—Robert A. Voigt, Jr.; Winstead Sechrest & Minick P.C.; Casimer K. Salys (57) ABSTRACT

A system and method for reducing timing uncertainties in a serial data signal A system may comprise a transmitter configured to transmit serial data to a receiver through a transmission medium, e.g., wireless, wired. The receiver may comprise an oscillator configured to generate multiple phases of a clock. The receiver may further comprise a retiming mechanism configured to reduce the timing uncertainties of the serial data received by the receiver by selecting a particular phase of the clock to be asserted to sample the serial data signal. The particular phase may be selected by selecting the appropriate synchronization state/retiming state. A retiming state indicates which particular phase of the clock should be asserted to sample the serial data signal. A synchronization state indicates which particular phase of the clock is the appropriate one to assert at a given transition of the serial data signal.

20 Claims, 9 Drawing Sheets

SYNCHRONIZATION STATE DETECTOR

CROSS REFERENCE TO RELATED APPLICATIONS

The present invention is related to the following U.S. Patent Applications which are incorporated herein by reference:

Ser. No. 09/820,507 entitled "Multiphase Retiming Mechanism" filed Mar. 29, 2001.

TECHNICAL FIELD

The present invention relates to the field of digital transmission, and more particularly to diminishing jitter in serialized data.

BACKGROUND INFORMATION

As electronic and computer technology continues to evolve, communication of information among different devices, either situated near by or at a distance becomes increasingly important. It is now more desirable than ever to provide high speed communications among different chips on a circuit board, different circuit boards in a system and different systems with each other. It is also desirable to provide high speed communications in intensive data consuming systems using graphical or video information, multiple input-output channels, local area networks, etc.

Data may be transmitted between different devices in a communication system through a "data link". Typically, data is transmitted in parallel whenever possible in order to increase bandwidth. However, due to cost, weight, interference (noise) and electrical loading considerations, parallel transmission is not feasible in many systems. In order to simplify the communications problem, data may be transmitted serially. By transmitting data serially, less hardware is required for the actual communications link between the different devices.

The transmitted serial data signal in the data link may have timing uncertainties as the result of interference, attenuation, skin effect, etc. These timing uncertainties are commonly referred to as "jitter." "Jitter" may refer to an offset of time as to when the serial data signal transitions from a high to a low state or from a low to a high state.

It would therefore be desirable to diminish jitter thereby improving the accuracy of the received serial data signal.

SUMMARY

The problems outlined above may at least in part be solved in some embodiments by reducing the timing uncertainties in the received serial data by selecting a particular phase of a clock to be asserted to sample the serial data during a period of the serial data.

In one embodiment, a system for reducing timing uncertainties in a serial data signal comprises a transmitter configured to transmit serial data to a receiver through a transmission medium, e.g., wireless, wired. The receiver may comprise an input configured to receive serial data. The receiver may further comprise an oscillator configured to generate phases of a clock. The receiver may further comprise a retiming mechanism configured to receive the serial data and the phases of the clock generated by the oscillator. The retiming mechanism may further be configured to reduce the timing uncertainties of the serial data received by the receiver by selecting a particular phase of the clock to be asserted to sample the serial data during a period of the serial data signal. The particular phase of the clock to be asserted to sample the serial data during a particular period of the serial data signal may be selected by selecting the appropriate synchronization state/retiming state. A retiming state indicates which particular phase of the clock should be asserted to sample the serial data during a particular period of the serial data. Each retiming state is correlated with a particular synchronization state. A synchronization state indicates which particular phase of the clock is the appropriate one to assert at a given transition of the serial data.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

A better understanding of the present invention can be obtained when the following detailed description is considered in conjunction with the following drawings, in which.

DETAILED DESCRIPTION

Figure 1:
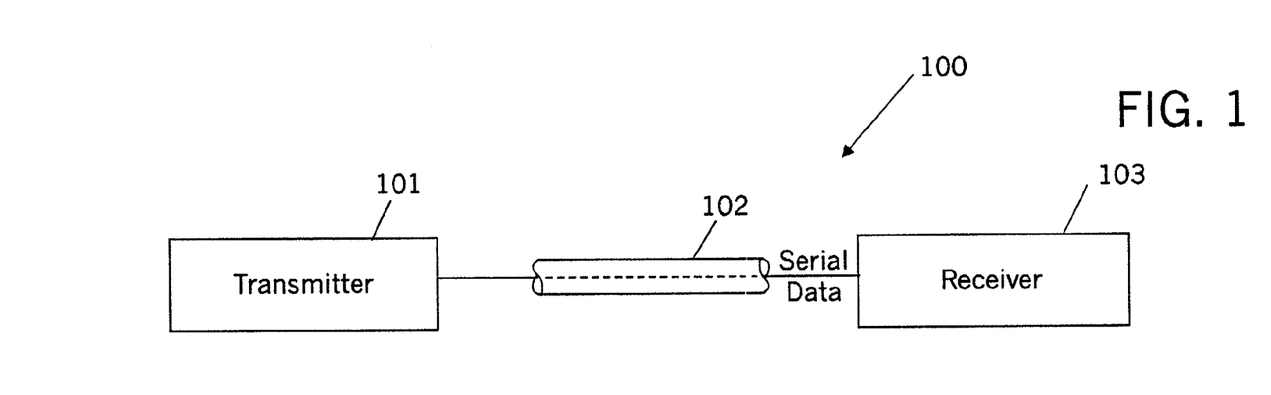
FIG. 1 illustrates an embodiment of the present invention of a serial data link.

FIG. 1—Serial Data Link

FIG. 1 illustrates an embodiment of the present invention of a serial data link 100 used in a communication system. As stated in the Background Information, data may typically be transmitted between various devices in a communication system through a data link. Typically, data is transmitted in parallel whenever possible in order to increase bandwidth. However, due to cost, weight, interference (noise) and electrical loading considerations, parallel transmission is not feasible in many systems. In order to simplify the communications problem, data may be transmitted serially across a serial data link 100 by a transmitter 101. Transmitter 101 may be configured to convert the parallel data to a serial form which may be transmitted through a medium 102, e.g., wired, wireless, to a receiver 103 configured to convert the serial data into parallel form which may then be transmitted to another device, e.g., computer, cellular phone.

Figure 2:
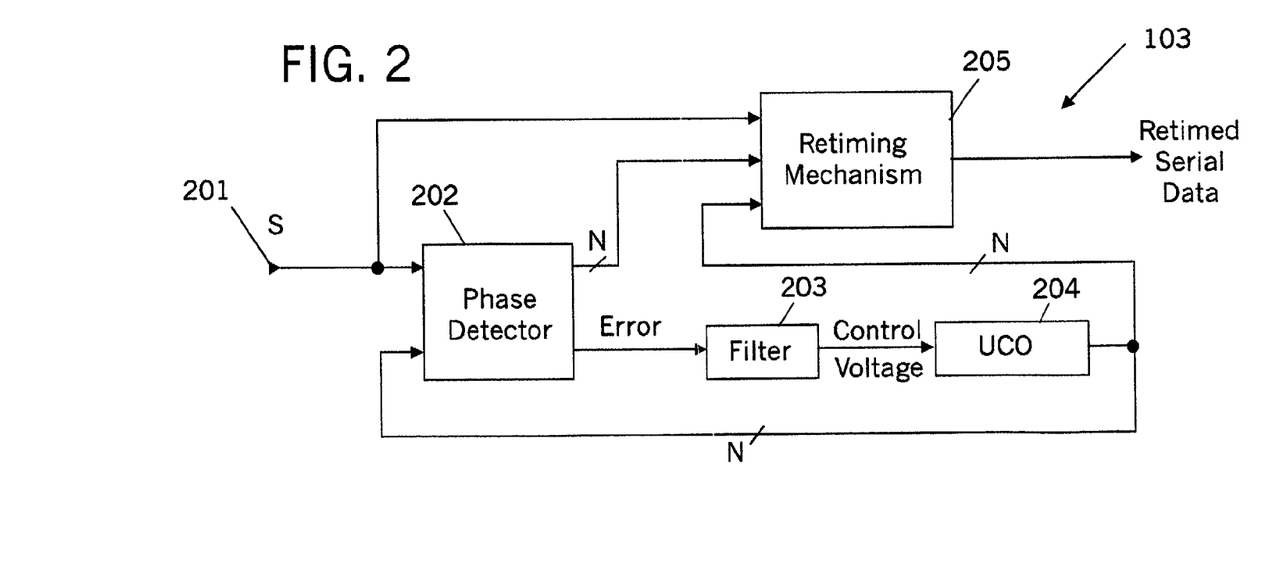
FIG. 2 illustrates an embodiment of a receiver in a serial data link configured in accordance with the present invention.

FIG. 2—Receiver

FIG. 2 illustrates an embodiment of the present invention of a receiver 103 configured to receive serial data 201 transmitted from transmitter 101 through medium 102, e.g., wired, wireless. Receiver may comprise a phase detector 202 configured to receive serial data 201 transmitted by transmitter 101 through medium 102, e.g., wired, wireless. Phase detector 202 may further be configured to generate N synchronization states that are inputted to retiming mechanism 205. Phase detector 202 may further be configured to generate an error signal. The functionality of phase detector 202 is described in greater detail in U.S. Publication No. 20020085657, filed on Dec. 28, 2000, entitled "Multiphase Clock Recovery Using D-Type Phase Detector," which is hereby incorporated herein by reference in its entirety. The error signal generated by phase detector 202 is filtered through filter 203 which outputs a control voltage used by oscillator 204, e.g., voltage controlled oscillator, to generate N phases of a clock that is inputted to retiming mechanism 205. In one embodiment, oscillator 204 may be configured to operate at a frequency lower than the serial data rate thereby saving power. The output of oscillator 204 is also inputted to phase detector 202 as illustrated in FIG. 2. Additional details regarding the functionality of oscillator 204 is described in related U.S. application Ser. Nos. 09/726,282 and 09/726,285, both filed on Nov. 30, 2000, which are hereby incorporated herein by reference in their entirety. Phase detector 202, filter 203 and oscillator 204, e.g., voltage controlled oscillator, may collectively be referred to as a clock and data recovery unit configured to extract a clock from the serial data stream 201 which is used to retime the data, i.e., diminish jitter, by retiming mechanism 205 as described in the description of FIGS. 4–8. The clock and data recovery unit is described in greater detail in U.S. Pat. No. 6,441,667, issued on Aug. 27, 2002, entitled "Multiphase Clock Generator," which is hereby incorporated herein by reference in its entirety.

Figure 3:
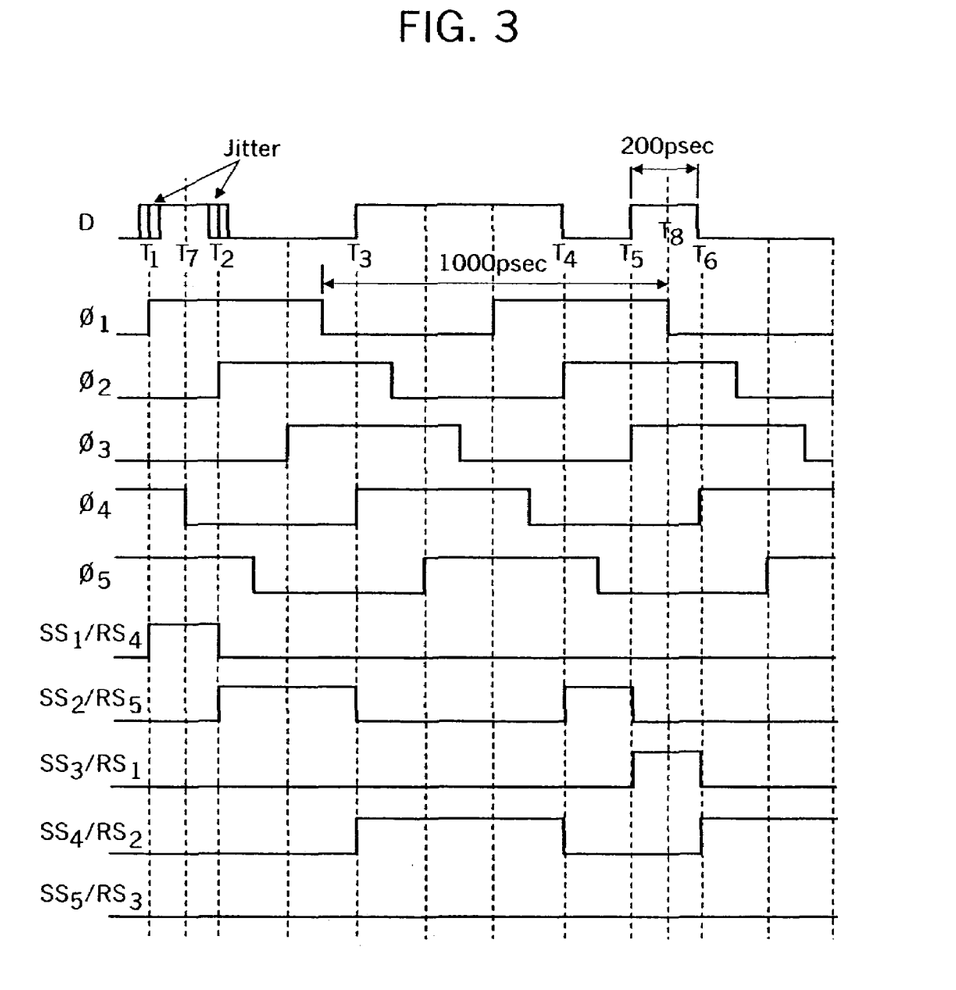
FIG. 3 is a timing diagram illustrating the timing of the serial data, the phases of a clock and the synchronization state/retiming state signals according to the present invention.

As stated above, the serial data signal 201 generated by transmitter 101 may have timing uncertainties as the result of interference, attenuation, skin effect, etc. These timing uncertainties are commonly referred to as "jitter." "Jitter" may refer to an offset of time as to when the serial data signal 201 transitions from a high to a low state or from a low to a high state as illustrated in FIG. 3. These timing uncertainties may be diminished by retiming mechanism 205 as described in the description of FIGS. 4–8.

FIG. 3—Timing Diagram

FIG. 3 is a timing diagram that illustrates the timing of serial data 201, the phases of a clock generated by oscillator 204 as well as the synchronization state/retiming state signals generated by phase detector 202. In the exemplary embodiment, oscillator 204 generates five phases of a clock which are designated as Ø1, Ø2, Ø3, Ø4 and Ø5. Furthermore, in the exemplary embodiment, there are five synchronization state/retiming state signals which are designated as $SS_1RS_4$, $SS_2RS_5$, $SS_3RS_1$, $SS_4RS_2$ and $SS_5RS_3$. A synchronization state refers to an indication as to which phase of the clock generated by oscillator 204 is the appropriate one to assert at a given transition of serial data 201. For example, referring to FIG. 3, synchronization state $SS_4$ is asserted at the point in time at T3 to indicate that phase Ø4 is the appropriate phase of the clock to be asserted since the rising edge of phase Ø4 coincides with the rising edge of serial data 201 at the point in time at T3. That is, synchronization state $SS_4$ indicates that phase Ø4 is the appropriate phase to assert at a given transition of serial data 201, e.g., serial data transitions from a low state to a high state. At the point in time at T4 when the serial data transitions from a high state to a low state, the synchronization state $SS_2$ is asserted since the rising edge of phase Ø2 coincides with the falling edge of the serial data at the point in time at T4. A retiming state refers to an indication as to which phase of the clock generated by oscillator 204 is the appropriate one to assert to sample the serial data 201 during a particular period of serial data 201 as will further be explained below. There is a one to one correlation between a particular synchronization state and a particular retiming state. For example, synchronization state $SS_1$ is correlated with the retiming state $RS_4$ which is indicated by the notation $SS_1RS_4$. Synchronization state $SS_2$ is correlated with the retiming state $RS_5$ which is indicated by the notation $SS_2RS_5$. Synchronization state $SS_3$ is correlated with the retiming state $RS_1$ which is indicated by the notation $SS_3RS_1$. Synchronization state $SS_4$ is correlated with the retiming state $RS_2$ which is indicated by the notation $SS_4RS_2$. Synchronization state $SS_5$ is correlated with the retiming state $RS_3$ which is indicated by the notation $SS_5RS_3$.

As stated above, "jitter" may refer to timing uncertainties when the serial data signal 201 transitions from a high to a low state or from a low to a high state. Referring to FIG. 3, an illustration of the jitter the serial data signal 201 experiences at points in time at T1 and T2 is shown. That is, the serial data signal 201 experiences an offset of time at a point in time at T1 when the serial data signal 201 transitions from a low state to a high state and experiences an offset of time at a point in time at T2 when the serial data signal 201 transitions from a high to a low state.

In one embodiment, jitter may be diminished by sampling the serial data signal 201 at a point in time when the serial data signal 201 is not likely to experience jitter. For example, if the serial data signal 201 were sampled during a particular period at a particular point in time, such as at T7, then jitter may be diminished. The retiming state refers to an indication as to which phase of the clock is the appropriate one to assert to sample the serial data 201 at a point in time when the serial data signal 201 is not likely to experience jitter. For example, retiming state $RS_4$ is asserted to indicate that phase Ø4 is the appropriate phase of the clock generated by oscillator 204 to assert to sample the serial data 201 at the point in time at T7 since the falling edge of phase Ø4 is aligned with the point in time at T7.

As stated above, each particular synchronization state is correlated with a particular retiming state. For example, synchronization state $SS_3$ is correlated with the retiming state $RS_1$. Referring to FIG. 3, synchronization state $SS_3$ is asserted at the point in time at T5 since phase Ø3 is aligned with rising edge of serial data 201 at the point in time at T7. Since synchronization state $SS_3$ is correlated with retiming state $RS_1$, retiming state $RS_1$ is concurrently activated. Retiming state $RS_1$ indicates that phase Ø1 is the appropriate phase to be asserted to sample serial data 201 at a point in time when the serial data signal 201 is not likely to experience jitter, e.g., point in time at T8. That is, $RS_1$ is asserted when synchronization state $SS_3$ is asserted to indicate that phase Ø1 is the appropriate phase to be asserted to sample serial data 201 at a point in time when the serial data signal 201 is not likely to experience jitter, e.g., point in time at T8.

The appropriate synchronization state/retiming state signals may be asserted according to logic embodied in retiming mechanism 205 as described below.

Figure 4:
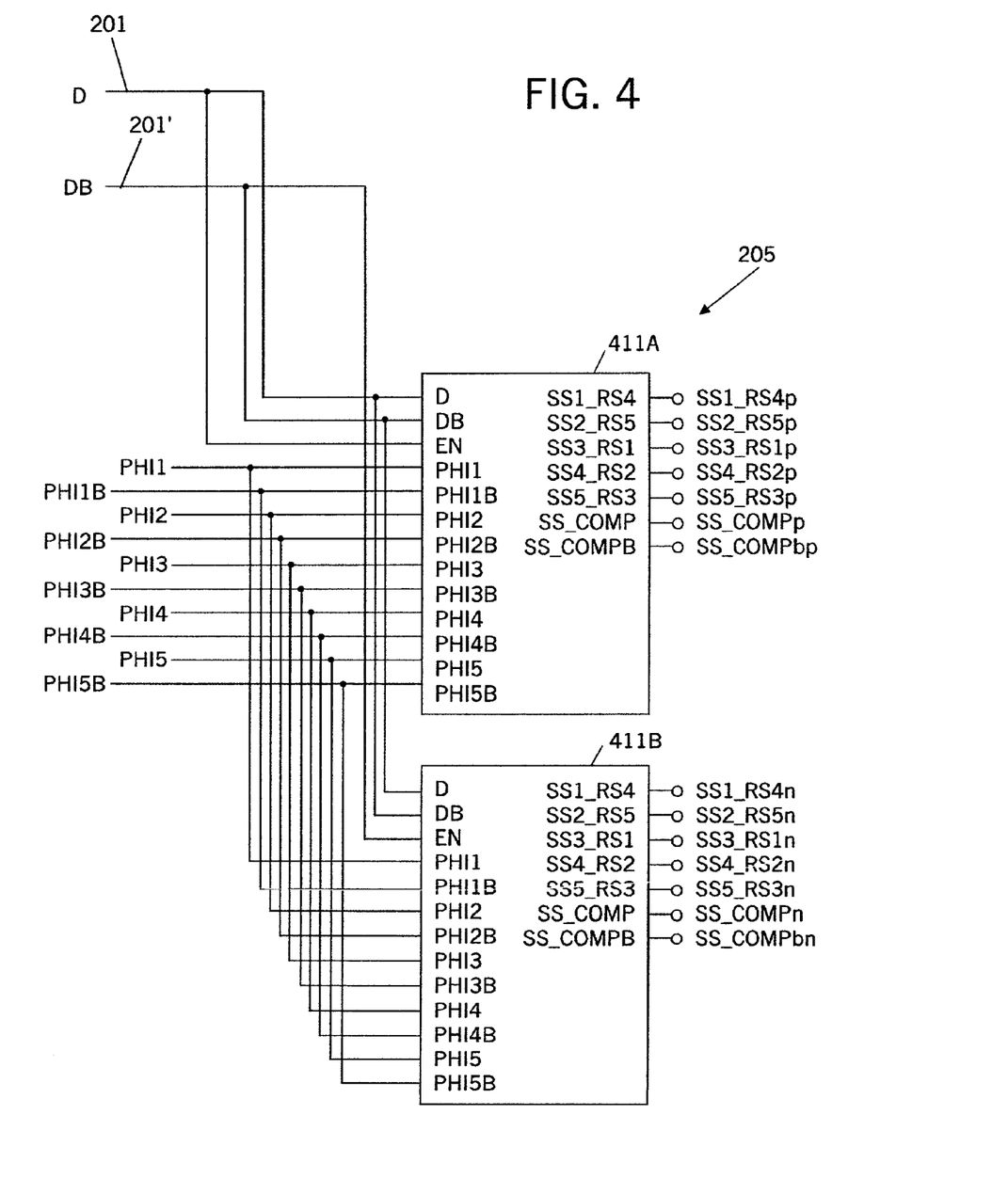
FIG. 4 illustrates an embodiment of the present invention of a retiming mechanism.

FIG. 4—Retiming Mechanism

FIG. 4 illustrates one embodiment of the present invention of retiming mechanism 205. Retiming mechanism 205 may comprise a synchronization state selector unit 411A for positive edge transitions and a synchronization state selector unit 411B for negative edge transitions as will be explained in greater detail in the detailed description of FIGS. 5–8. Synchronization state selector unit 411A may be configured to generate logical values for each synchronization state/retiming state pair for each positive edge transition of serial data 201. That is, synchronization state selector unit 411A is enabled when serial data 201 is high. Synchronization state selector unit 411B may be configured to generate logical values for each synchronization state/retiming state pair for each negative edge transition of serial data 201. That is, synchronization state selector unit 411B is enabled when serial data 201 is low. Synchronization state selector units 411A and 411B may collectively or individually be referred to as synchronization state selector units 411 or synchronization state selector unit 411, respectively.

Synchronization state selector unit 411 receives as inputs each phase of the clock generated by oscillator 204 indicated as PHI1, PHI2, PHI3, PHI4 and PHI5 as well as a complement of each phase of the clock generated by oscillator 204 indicated as PHI1B, PHI2B, PHI3B, PHI4B and PHI5B. It is noted that the notation of PHI1–PHI5 is the same as the notation of Ø1–Ø5. Synchronization state selector unit 411 may further be configured to receive as inputs serial data 201 and the complement of serial data 201'. The outputs of synchronization state selector unit 411A are the synchronization state/retiming state signals which are designated as $SS_1RS_4p$, $SS_2RS_5p$, $SS_3RS_1p$, $SS_4RS_2p$ and $SS_5RS_3p$ as well as a completion signal designated as SS_COMPp and the complement of the completion signal designated as SS_COMPbp when the serial data signal 201 transitions from a low state to a high state, i.e., when the serial data signal 201 is rising. The outputs of synchronization state selector unit 411B are the synchronization state/retiming state signals which are designated as $SS_1RS_4n$, $SS_2RS_5n$, $SS_3RS_1n$, $SS_4RS_2n$ and $SS_5RS_3n$ as well as a completion signal designated as SS_COMPn and the complement of the completion signal designated as SS_COMPbn when the serial data signal 201 transitions from a high state to a low state, i.e., when the serial data signal 201 is falling.

Figure 5:
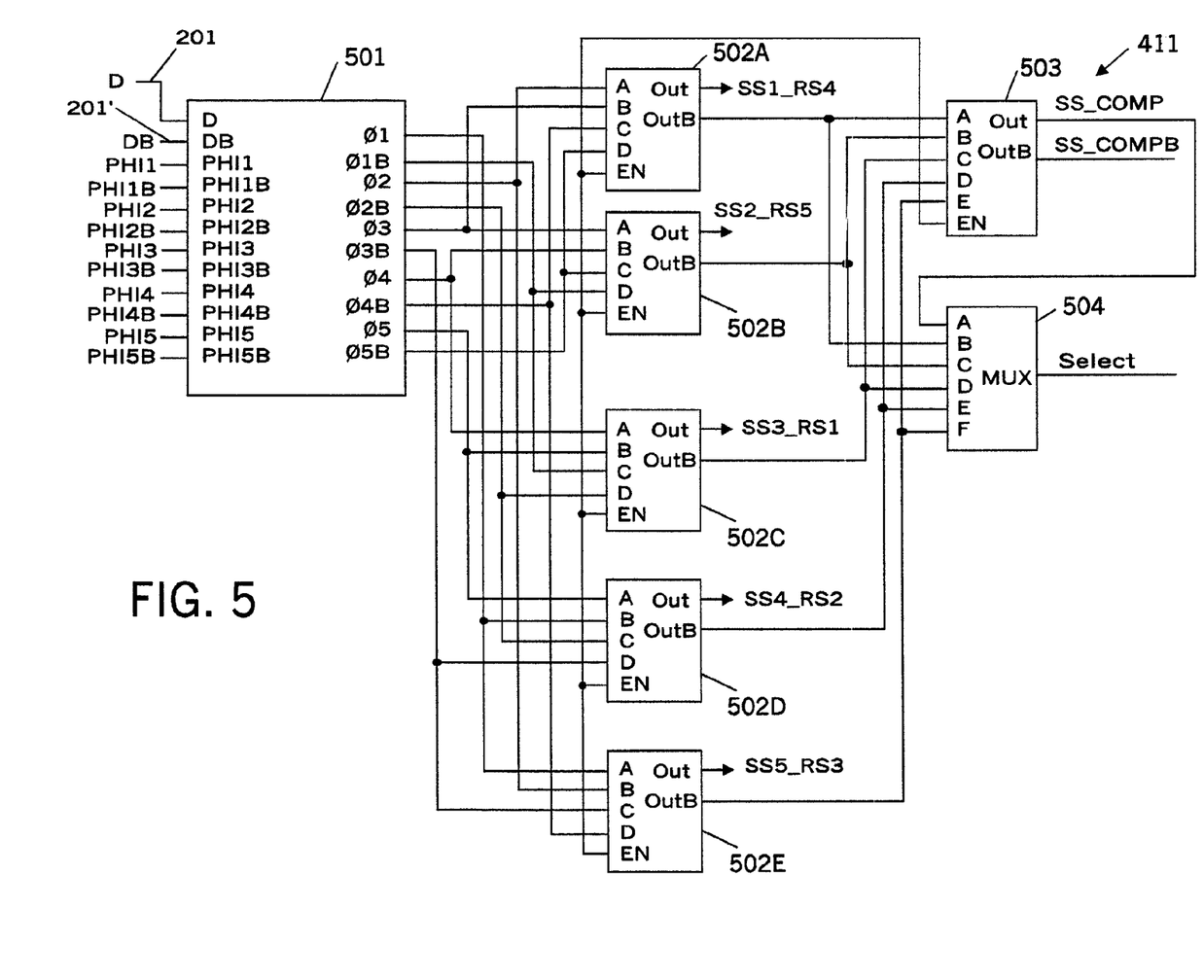
FIG. 5 illustrates an embodiment of a synchronization state selector unit in a retiming mechanism configured in accordance with the present invention.

FIG. 5—Synchronization State Selector Unit

FIG. 5 illustrates one embodiment of the present invention of a synchronization state selector unit 411. Synchronization state selector unit 411 may comprise a sample clock mechanism 501 configured to generate sample clock phase values as will further be described in the description of FIGS. 6A–B. That is, sample clock mechanism 501 indicates the logical state, e.g., low or high, of each phase of the clock generated by oscillator 204 at a particular point in time. Synchronization state selector unit 411 may further comprise a plurality of synchronization state detectors 502A–E configured to generate the logical state, e.g., low or high, of a particular synchronization state/retiming state pair, e.g., $SS_1RS_4$, $SS_2RS_5$, $SS_3RS_1$, $SS_4RS_2$, $SS_5RS_3$, as will be further described in the description in FIG. 7. Synchronization state detectors 502A–E may collectively or individually be referred to as synchronization state detectors 502 or synchronization state detector 502, respectively. It is noted that synchronization state selector unit 411 may comprise a different number of synchronization state detectors 502 and that FIG. 5 is illustrative. Synchronization state selector unit 411 may further comprise a synchronization state completion detector 503 configured to generate a completion signal indicating the time to sample the inputs to select a particular synchronization state/retiming state pair, e.g. $SS_1RS_4$, $SS_2RS_5$, $SS_3RS_1$, $SS_4RS_2$, $SS_5RS_3$, as will be further described in the description in FIG. 8.

Figures 6, 6A:
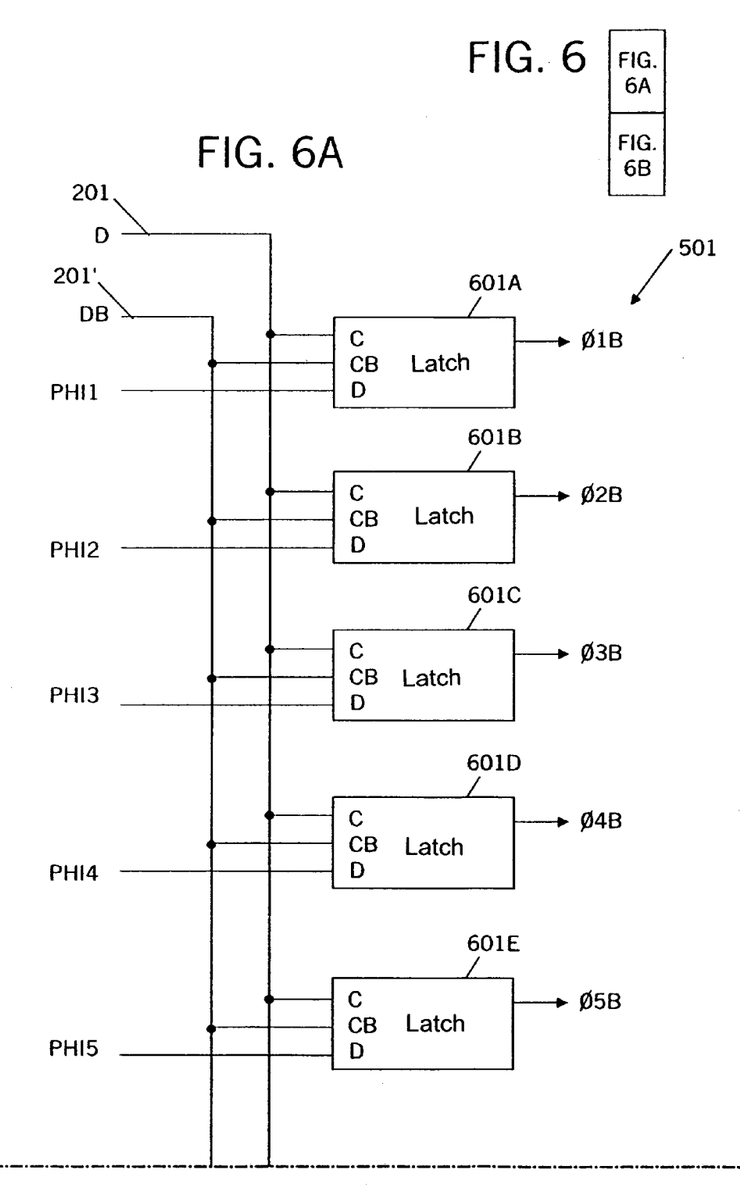
FIGS. 6A–B illustrate an embodiment of a sample clock mechanism in a synchronization state selector unit configured in accordance with the present invention.
Figure 6B:
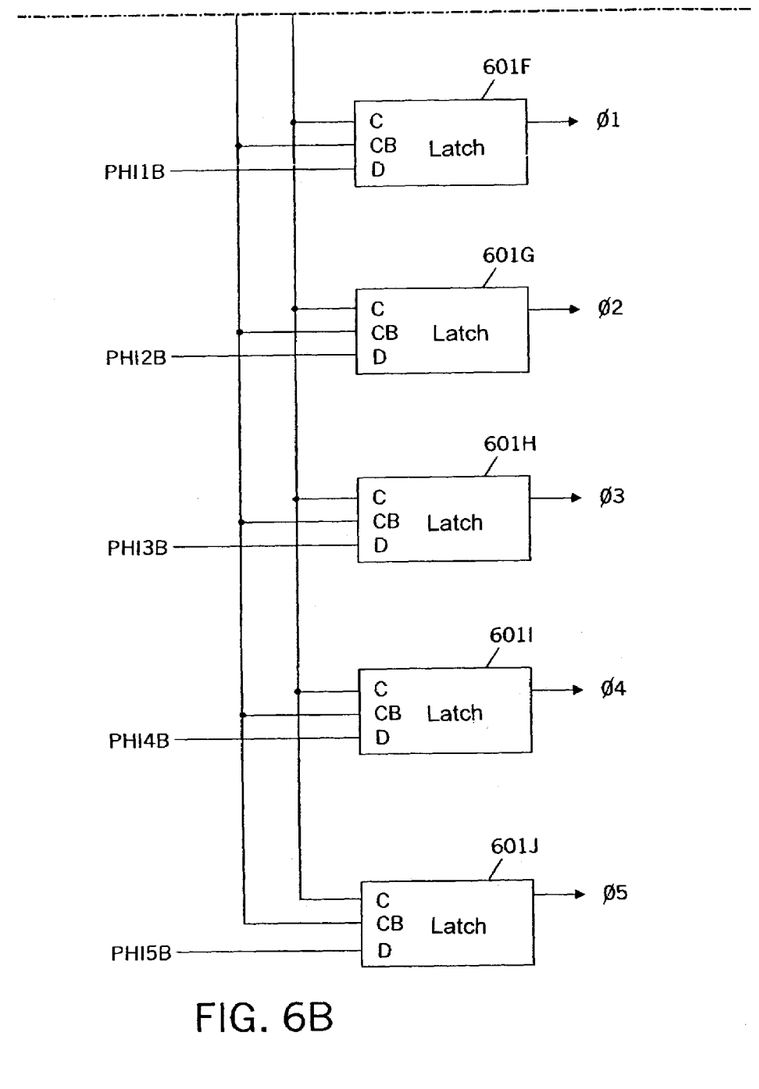

FIGS. 6A–B—Sample Clock Mechanism

FIGS. 6A–B illustrate one embodiment of the present invention of a sample clock mechanism 501. Sample clock mechanism may comprise a plurality of latches 601A–J configured to sample a particular phase of the clock generated by oscillator 204 at a particular point in time. Latches 601A–J may collectively or individually be referred to as latches 601 or latch 601, respectively. It is noted that sample clock mechanism 501 may comprise a different number of latches 601 corresponding to a different number of phases of the clock generated by oscillator 204 and that FIGS. 6A–B are illustrative.

Each latch 601 samples a particular phase, e.g., PHI1, at each transition of serial data 201. For example, latch 601A samples phase PHI1 to produce an output of Ø1B, i.e., complement of phase Ø1. Latch 601B samples phase PHI2 to produce an output of Ø2B, i.e., complement of phase Ø2. Latch 601C samples phase PHI3 to produce an output of Ø3B, i.e., complement of phase Ø3. Latch 601D samples phase PHI4 to produce an output of Ø4B, i.e., complement of phase Ø4. Latch 601E samples phase PHI5 to produce an output of Ø5B, i.e., complement of phase Ø5. Latch 601F samples phase PHI1B, i.e., complement of PHI1, to produce an output of Ø1. Latch 601G samples phase PHI2B, i.e., complement of PHI2, to produce an output of Ø2. Latch 601H samples phase PHI3B, i.e., complement of PHI3, to produce an output of Ø3. Latch 601I samples phase PHI4B, i.e., complement of PHI4, to produce an output of Ø4. Latch 601J samples phase PHI5B, i.e., complement of PHI5, to produce an output of Ø5. Each latch 601 may further be configured to receive an input of serial data 201 as well as the complement of serial data 201'. As stated above, the outputs of latches 601 may then be inputted to synchronization state detectors 502A–E configured to generate the logical state, e.g., low or high, of a particular synchronization state/retiming state pair, e.g., $SS_1RS_4$, $SS_2RS_5$, $SS_3RS_1$, $SS_4RS_2$ and $SS_5RS_3$, as described below.

Figure 7:
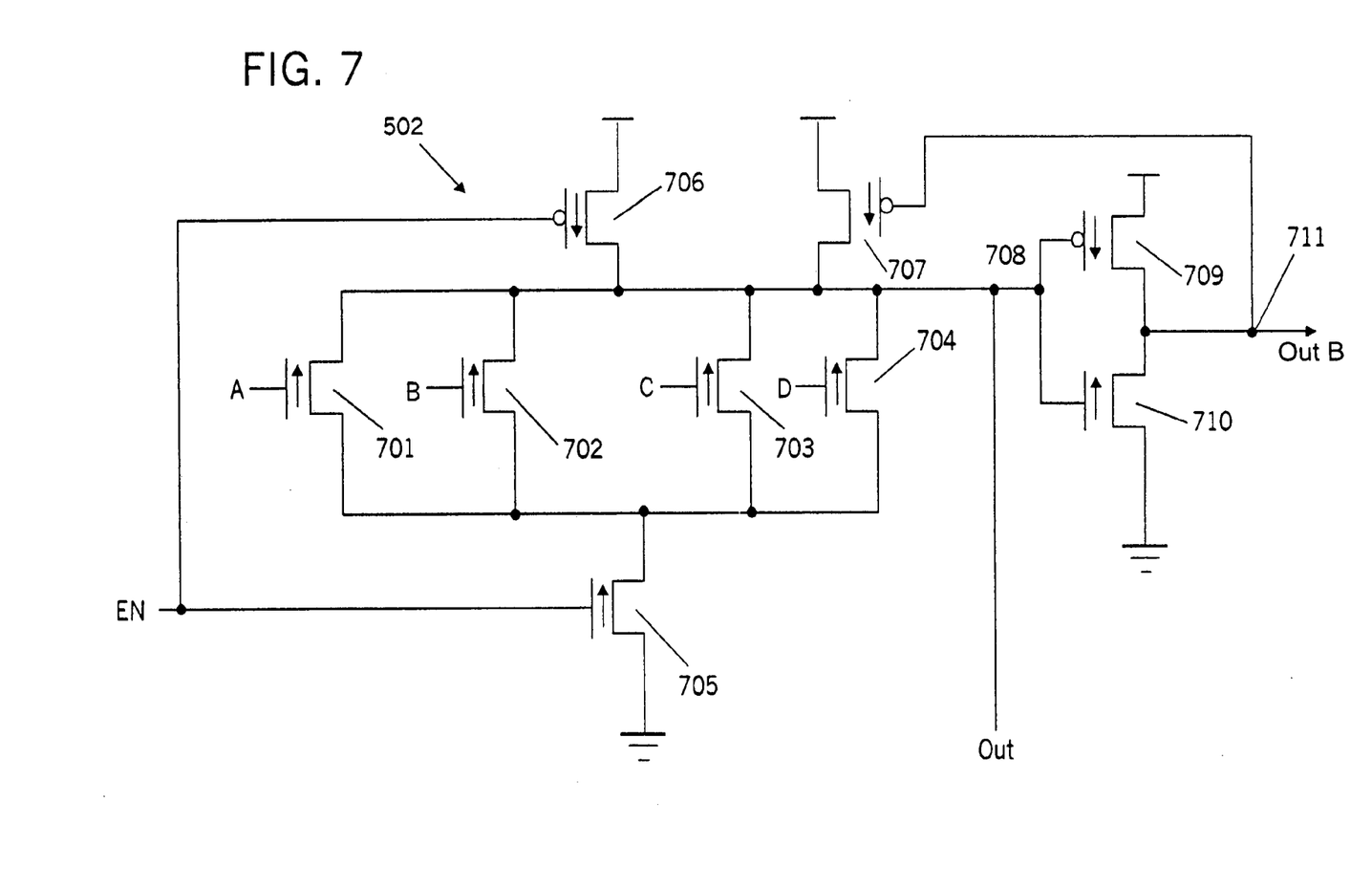
FIG. 7 illustrates an embodiment of a synchronization state detector in a synchronization state selector unit configured in accordance with the present invention.

FIG. 7—Synchronization State Detector

FIG. 7 illustrates one embodiment of the present invention of a synchronization state detector 502 configured to generate the logical state, e.g., low or high, of a particular synchronization state/retiming state pair, e.g., $SS_1RS_4$, $SS_2RS_5$, $SS_3RS_1$, $SS_4RS_2$, $SS_5RS_3$. Each synchronization state detector 502 may be configured to output the logical state of a particular synchronization state/retiming state pair, e.g., $SS_1RS_4$, $SS_2RS_5$, $SS_3RS_1$, $SS_4RS_2$, $SS_5RS_3$. For example, synchronization state detector 502 may be configured to output the logical state of synchronization state/retiming state pair $SS_1RS_4$. Synchronization state detector 502B may be configured to output the logical state of synchronization state/retiming state pair $SS_2RS_5$. Synchronization state detector 502C may be configured to output the logical state of synchronization state/retiming state pair $SS_3RS_1$. Synchronization state detector 502D may be configured to output the logical state of synchronization state/retiming state pair $SS_4RS_2$. Synchronization state detector 502E may be configured to output the logical state of synchronization state/retiming state pair $SS_5RS_3$. The following table, Table 1, characterizes when each particular synchronization state/retiming state pair. e.g., $SS_1RS_4$, $SS_2RS_5$, $SS_3RS_1$, SS4RS2, SS5RS3, may be asserted.

| Ø1 | Ø2 | Ø3 | Ø4 | Ø5 | Synch State | Retime State |
|----|----|----|----|----|-------------|--------------|
| X  | 0  | 0  | 1  | 1  | 1           | 4            |
| 1  | X  | 0  | 0  | 1  | 2           | 5            |
| 1  | 1  | X  | 0  | 0  | 3           | 1            |
| 0  | 1  | 1  | X  | 0  | 4           | 2            |
| 0  | 0  | 1  | 1  | X  | 5           | 3            |

It is noted that the "X" notation in Table 1 indicates that the state of that particular phase of the clock generated by oscillator 204 is not relevant in determining the state of the particular synchronization state/retiming state pair, e.g., $SS_1RS_4$, $SS_2RS_5$, $SS_3RS_1$, $SS_4RS_2$, $SS_5RS_3$.

According to Table 1, synchronization state detector 502A may output the logical state of synchronization state/retiming state pair $SS_1RS_4$ based on performing the logical AND operation on Ø2B, Ø3B, Ø4 and Ø5. Using DeMorgan's theorem, the logical AND operation Ø2B, Ø3B, Ø4 and Ø5 is equivalent to the logical NOR operation on Ø2, Ø3, Ø4B and Ø5B. Synchronization state detector 502B may output the logical state of synchronization state/retiming state pair $SS_2RS_5$ based on performing the logical AND operation on Ø1, Ø3B, Ø4B and Ø5. Using DeMorgan's theorem, the logical AND operation Ø1, Ø3B, Ø4B and Ø5 is equivalent to the logical NOR operation on Ø1B, Ø3, Ø4 and Ø5B. Synchronization state detector 502C may output the logical state of synchronization state/retiming state pair $SS_3RS_1$ based on performing the logical AND operation on Ø1, Ø2, Ø4B and Ø5B. Using DeMorgan's theorem, the logical AND operation Ø1, Ø2, Ø4B and Ø5B is equivalent to the logical NOR operation on Ø1B, Ø2B, Ø4 and Ø5. Synchronization state detector 502D may output the logical state of synchronization state/retiming state pair $SS_4RS_2$ based on performing the logical AND operation on Ø1B, Ø2, Ø3 and Ø5B. Using DeMorgan's theorem, the logical AND operation Ø1B, Ø2, Ø3 and Ø5B is equivalent to the logical NOR operation on Ø1, Ø2B, Ø3B and Ø5. Synchronization state detector 502E may output the logical state of synchronization state/retiming state pair $SS_5RS_3$ based on performing the logical AND operation on Ø1B, Ø2B, Ø3 and Ø4. Using DeMorgan's theorem, the logical AND operation Ø1B, Ø2B, Ø3 and Ø4 is equivalent to the logical NOR operation on Ø1, Ø2, Ø3B and Ø4B.

Referring to FIG. 7, synchronization state detector 502 may be configured to perform the logical OR operation on particular phases of the clock generated by oscillator 204. Synchronization state detector 502 may comprise a plurality of transistors 701, 702, 703, 704, 705, 706 and 707 configured to function as an NOR gate. In the exemplary embodiment, transistors 701, 702, 703, 704 and 705 are n-type transistors. In the exemplary embodiment, transistors 706 and 707 are p-type transistors. The output, OUT, at node 708 is consequently equivalent to the logical NOR operation on the inputs to transistors 701, 702, 703, 704, i.e., the logical NOR operation on A, B, C and D. The output at node 708 may be inverted by an inverter formed by transistors 709 and 710 to produce an output, OUTB at node 711. By inverting the output at node 708, synchronization state detector 502 is configured to perform the logical OR operation on the inputs to transistors 701, 702, 703, 704, i.e., the logical OR operation on A, B, C and D. The output, OUTB, is equivalent to the complement of the value of the output OUT. It is noted that the inverter formed by transistors 709 and 710 as well as transistor 707 function as a keeper circuit to prevent node 708 from discharging due to leakage. It is further noted that any number and type of transistors may be used to design a NOR gate and/or inverter and that FIG. 7 is illustrative. It is further noted that the output may be sampled at output, OUT, at node 708 instead of at output, OUTB, at node 711 since the delay at node 708 may be significantly less than the delay at node 711.

Referring to FIG. 7, the inputs, A, B, C and D, to transistors 701, 702, 703, 704, respectively, represent the four pertinent phases of the clock generated by oscillator 204 used to output the logical state of a particular synchronization state/retiming state pair, e.g., $SS_1RS_4$, $SS_2RS_5$, $SS_3RS_1$, $SS_4RS_2$, $SS_5RS_3$, as characterized in Table 1. For example, synchronization state detector 502A receives the inputs of Ø2, Ø3, Ø4B and Ø5B to determine the logical state of $SS_1RS_4$. As stated above, synchronization state detector 502A is configured to perform the logical NOR operation on Ø2, Ø3, Ø4B and Ø5B. According to Table 1, synchronization state/retiming state pair $SS_1RS_4$ is asserted when Ø2 is low, Ø3 is low, Ø4 is high and Ø5 is high. When that occurs, transistors 701, 702, 703 and 704 are deactivated, i.e., turned off. Node 708 remains high, i.e., turned on, since transistors 706 and 707 initially precharged node 708. Furthermore, node 708 remains high, i.e., turned on, since the keeper circuit prevents node 708 from discharging due to leakage. Subsequently, when Ø2 is low, Ø3 is low, Ø4 is high and Ø5 is high, synchronization state detector 502A asserts its respective synchronization state/retiming state pair $SS_1RS_4$. The complement of $SS_1RS_4$ produced at output OUTB would be deasserted. If either Ø2 is not low or Ø3 is not low or Ø4 is not high or Ø5 is not high, then synchronization state detector 502A deasserts its respective synchronization state/retiming state pair $SS_1RS_4$. The complement of $SS_1RS_4$ produced at output OUTB would be asserted.

Synchronization state detector 502B receives the inputs of Ø1B, Ø3, Ø4 and Ø5B to determine the logical state of $SS_2RS_5$. As stated above, synchronization state detector 502B is configured to perform the logical NOR operation on Ø1B, Ø3, Ø4 and Ø5B. According to Table 1, synchronization state/retiming state pair $SS_2RS_5$ is asserted when Ø1 is high, Ø3 is low, Ø4 is low and Ø5 is high. When that occurs, transistors 701, 702, 703 and 704 are deactivated, i.e., turned off. Node 708 remains high, i.e., turned on, since transistors 706 and 707 initially precharged node 708. Furthermore, node 708 remains high, i.e., turned on, since the keeper circuit prevents node 708 from discharging due to leakage. Subsequently, when Ø1 is high, Ø3 is low, Ø4 is low and Ø5 is high, synchronization state detector 502B asserts its respective synchronization state/retiming state pair $SS_2RS_5$. The complement of $SS_2RS_5$ produced at output OUTB would be deasserted. If either Ø1 is not high or Ø3 is not low or Ø4 is not low or Ø5 is not high, then synchronization state detector 502B deasserts its respective synchronization state/retiming state pair $SS_2RS_5$. The complement of $SS_2RS_5$ produced at output OUTB would be asserted.

Synchronization state detector 502C receives the inputs of Ø1B, Ø2B, Ø4 and Ø5 to determine the logical state of $SS_3RS_1$. As stated above, synchronization state detector 502C is configured to perform the logical NOR operation on Ø1B, Ø2B, Ø4 and Ø5. According to Table 1, synchronization state/retiming state pair $SS_3RS_1$ is asserted when Ø1 is high, Ø2 is high, Ø4 is low and Ø5 is low. When that occurs, transistors 701, 702, 703 and 704 are deactivated, i.e., turned off. Node 708 remains high, i.e., turned on, since transistors 706 and 707 initially precharged node 708. Furthermore, node 708 remains high, i.e., turned on, since the keeper circuit prevents node 708 from discharging due to leakage. Subsequently, when Ø1 is high, Ø2 is high, Ø4 is low and Ø5 is low, synchronization state detector 502C asserts its respective synchronization state/retiming state pair $SS_3RS_1$. The complement of $SS_3RS_1$ produced at output OUTB would be deasserted. If either Ø1 is not high or Ø2 is not high or Ø4 is not low or Ø5 is not low, then synchronization state detector 502C deasserts its respective synchronization state/retiming state pair $SS_3RS_1$. The complement of $SS_3RS_1$ produced at output OUTB would be asserted.

Synchronization state detector 502D receives the inputs of Ø1, Ø2B, Ø3B and Ø5 to determine the logical state of $SS_4RS_2$. As stated above, synchronization state detector 502D is configured to perform the logical NOR operation on Ø1, Ø2B, Ø3B and Ø5. According to Table 1, synchronization state/retiming state pair $SS_4RS_2$ is asserted when Ø1 is low, Ø2 is high, Ø3 is high and Ø5 is low. When that occurs, transistors 701, 702, 703 and 704 are deactivated, i.e., turned off. Node 708 remains high, i.e., turned on, since transistors 706 and 707 initially precharged node 708. Furthermore, node 708 remains high, i.e., turned on, since the keeper circuit prevents node 708 from discharging due to leakage. Subsequently, when Ø1 is low, Ø2 is high, Ø3 is high and Ø5 is low, synchronization state detector 502D asserts its respective synchronization state/retiming state pair $SS_4RS_2$. The complement of $SS_4RS_2$ produced at output OUTB would be deasserted. If either Ø1 is not low or Ø2 is not high or Ø3 is not high or Ø5 is not low, then synchronization state detector 502D deasserts its respective synchronization state/retiming state pair $SS_4RS_2$. The complement of $SS_4RS_2$ produced at output OUTB would be asserted.

Synchronization state detector 502E receives the inputs of Ø1, Ø2, Ø3B and Ø4B to determine the logical state of $SS_5RS_3$. As stated above, synchronization state detector 502E is configured to perform the logical NOR operation on Ø1, Ø2, Ø3B and Ø4B. According to Table 1, synchronization state/retiming state pair $SS_5RS_3$ is asserted when Ø1 is low, Ø2 is low, Ø3 is high and Ø4 is high. When that occurs, transistors 701, 702, 703 and 704 are deactivated, i.e., turned off. Node 708 remains high, i.e., turned on, since transistors 706 and 707 initially precharged node 708. Furthermore, node 708 remains high, i.e., turned on, since the keeper circuit prevents node 708 from discharging due to leakage. Subsequently, when Ø1 is low, Ø2 is low, Ø3 is high and Ø4 is high, synchronization state detector 502E asserts its respective synchronization state/retiming state pair $SS_5RS_3$. The complement of $SS_5RS_3$ produced at output OUTB would be deasserted. If either Ø1 is not low or Ø2 is not low or Ø3 is not high or Ø4 is not high, then synchronization state detector 502E deasserts its respective synchronization state/retiming state pair $SS_5RS_3$. The complement of $SS_5RS_3$ produced at output OUTB would be asserted.

Figure 8:
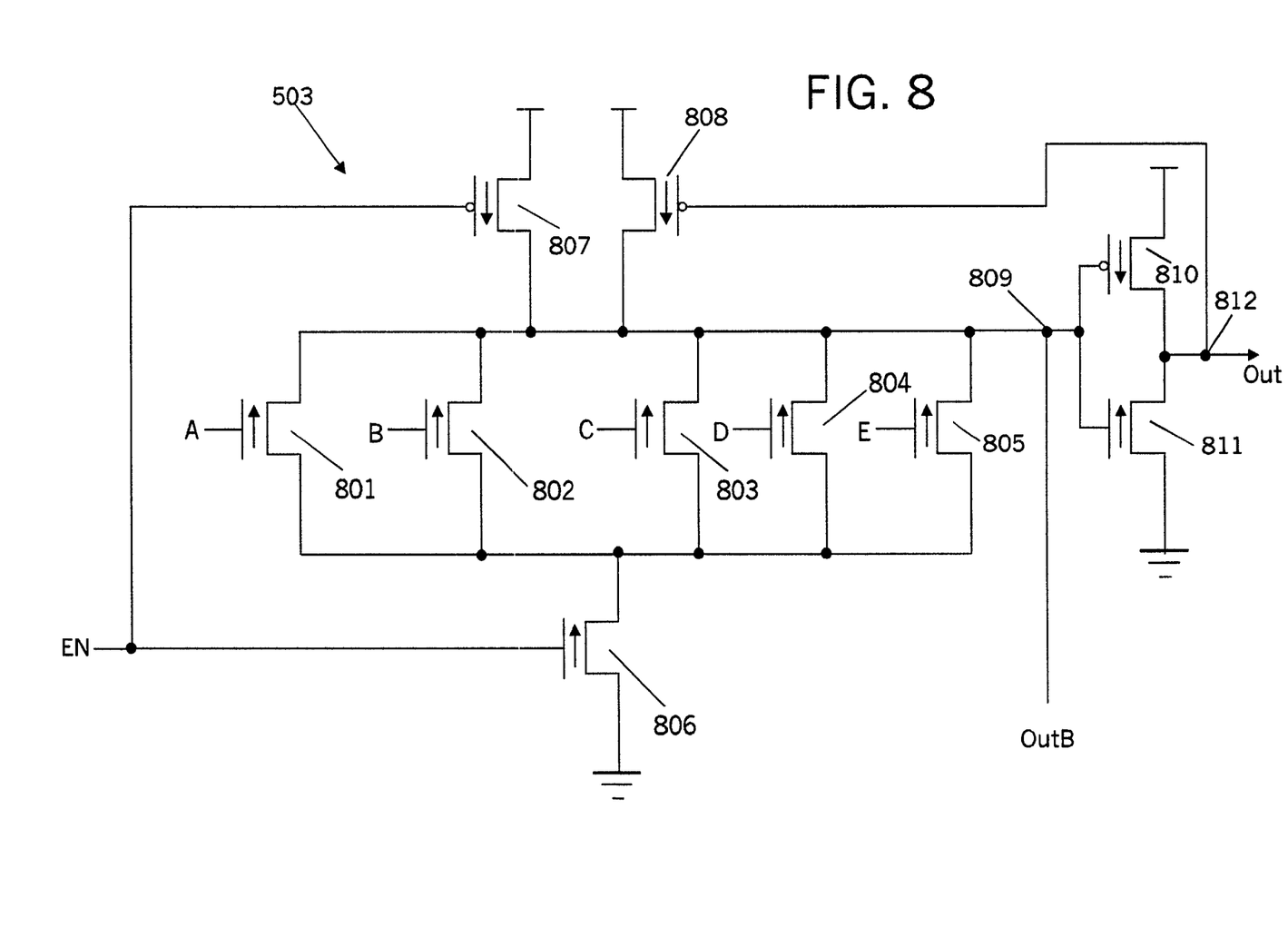
FIG. 8 illustrates an embodiment of a synchronization state completion detector in a synchronization state selector unit configured in accordance with the present invention.

The output OUTB of each synchronization state detector 502, i.e., synchronization state detectors 502A–E, may be inputted to synchronization state completion detector 503 configured to generate a completion signal indicating the time to sample the inputs to select a particular synchronization state/retiming state pair, e.g. $SS_1RS_4$, $SS_2RS_5$, $SS_3RS_1$, $SS_4RS_2$, $SS_5RS_3$, as described below.

FIG. 8—Synchronization State Completion Detector

FIG. 8 illustrates one embodiment of the present invention of synchronization state completion detector 503 configured to generate a completion signal indicating the time to sample the inputs to select a particular synchronization state/retiming state pair, e.g. $SS_1RS_4$, $SS_2RS_5$, $SS_3RS_1$, $SS_4RS_2$, $SS_5RS_3$. Synchronization state completion detector 503 may be configured similarly to synchronization state detector 502 except that synchronization state completion detector 503 comprises an extra input and therefore an extra transistor in the NOR gate.

Referring to FIG. 8, synchronization state completion detector 503 may comprise a plurality of transistors 801, 802, 803, 804, 805, 806, 807 and 808 configured to function as an NOR gate. In the exemplary embodiment, transistors 801, 802, 803, 804, 805 and 806 are n-type transistors. In the exemplary embodiment, transistors 807 and 808 are p-type transistors. The output, OUTB, at node 809 is consequently equivalent to the logical NOR operation on the inputs to transistors 801, 802, 803, 804, 805, i.e., the logical NOR operation on A, B, C, D and E. The output at node 809 may be inverted by an inverter formed by transistors 810 and 811 to produce an output, OUT at node 812. By inverting the output at node 809, synchronization state completion detector 503 is configured to perform the logical OR operation on the inputs to transistors 801, 802, 803, 804, 805, i.e., the logical OR operation on A, B, C, D and E. The output, OUT, is equivalent to the complement of the value of the output OUTB. It is noted that the inverter formed by transistors 810 and 811 as well as transistor 808 function as a keeper circuit to prevent node 809 from discharging due to leakage. It is further noted that any number and type of transistors may be used to design a NOR gate and/or inverter and that FIG. 8 is illustrative. It is further noted that the output may be sampled at output, OUTB, at node 809 instead of at output, OUT, at node 812 since the delay at node 809 may be significantly less than the delay at node 812.

Initially all the inputs to synchronization state completion detector 503 are precharged low. As stated above, node 708 in each of the synchronization state detectors 502 are precharged high thereby causing the output, OUT, of each synchronization state detector 502 to be high. The complements of the output, OUTB, in each synchronization state detector 502 are initially low which are then inputted to synchronization state completion detector 503.

When one of the inputs to state completion detector 503 is asserted, i.e., becomes high, then the completion signal, SS_COMP, at node 812 is asserted. That is, when one of the inputs to state completion detector 503 is asserted, then the output of the NOR gate at node 809, SS_COMPB, is low instead of high. The completion signal, SS_COMP, would then been asserted. Once one of the inputs is asserted, synchronization state completion detector may be configured to issue a strobe signal to detect which of the input signals has not changed state.

As stated above, node 708 in each of the synchronization state detectors 502 is precharged high thereby causing the output, OUT, of each synchronization state detector 502 to be high. When a particular synchronization state/retiming state is asserted as described in the description of FIG. 7, the other synchronization states/retiming states are deasserted. Subsequently, the output, OUT, of the particular synchronization state detector 502 whose synchronization state/retiming state is asserted remains activated, i.e., high. The output, OUT, of the other synchronization state detectors 502 are deasserted. As stated above, the complements of the outputs, i.e., synchronization state/retiming state values, are inputted to synchronization state completion detector 503. When the output of at least one of the synchronization states/retiming states is deasserted, i.e., when at least one of the complements of the synchronization states/retiming states is asserted, the output of the NOR gate at node 809 in synchronization state completion detector 503 becomes low instead of high thereby asserting the completion signal, SS_COMP. Upon asserting the completion signal, SS_COMP, synchronization state completion detector 503 may be configured to issue a strobe signal to detect which of the input signals has not changed state.

In one embodiment, a multiplexer 504 may be used to detect which of the input signals has not changed state. Multiplexer 504 may be configured to receive the completion signal, SS_COMP, as well as the output, OUTB, of each synchronization state detector 502. Multiplexer 504 may then be configured to output the selected synchronization state/retiming state, SELECT, which corresponds to the input signal of synchronization state completion detector 503 that has not changed state, i.e., input signal of synchronization state completion detector 503 that remains low. For example, if synchronization state/retiming state $SS_1RS_4$ were asserted, then all the inputs to synchronization state completion detector 503 and multiplexer 504 would change state, i.e., become active high, except the complement of the synchronization state/retiming state $SS_1RS_4$ asserted. Since SS_COMP becomes active high when a particular synchronization state/retiming state is asserted, the one complemented input that remains deasserted, i.e., low, corresponds to the particular synchronization state/retiming state asserted.

Figure 9:
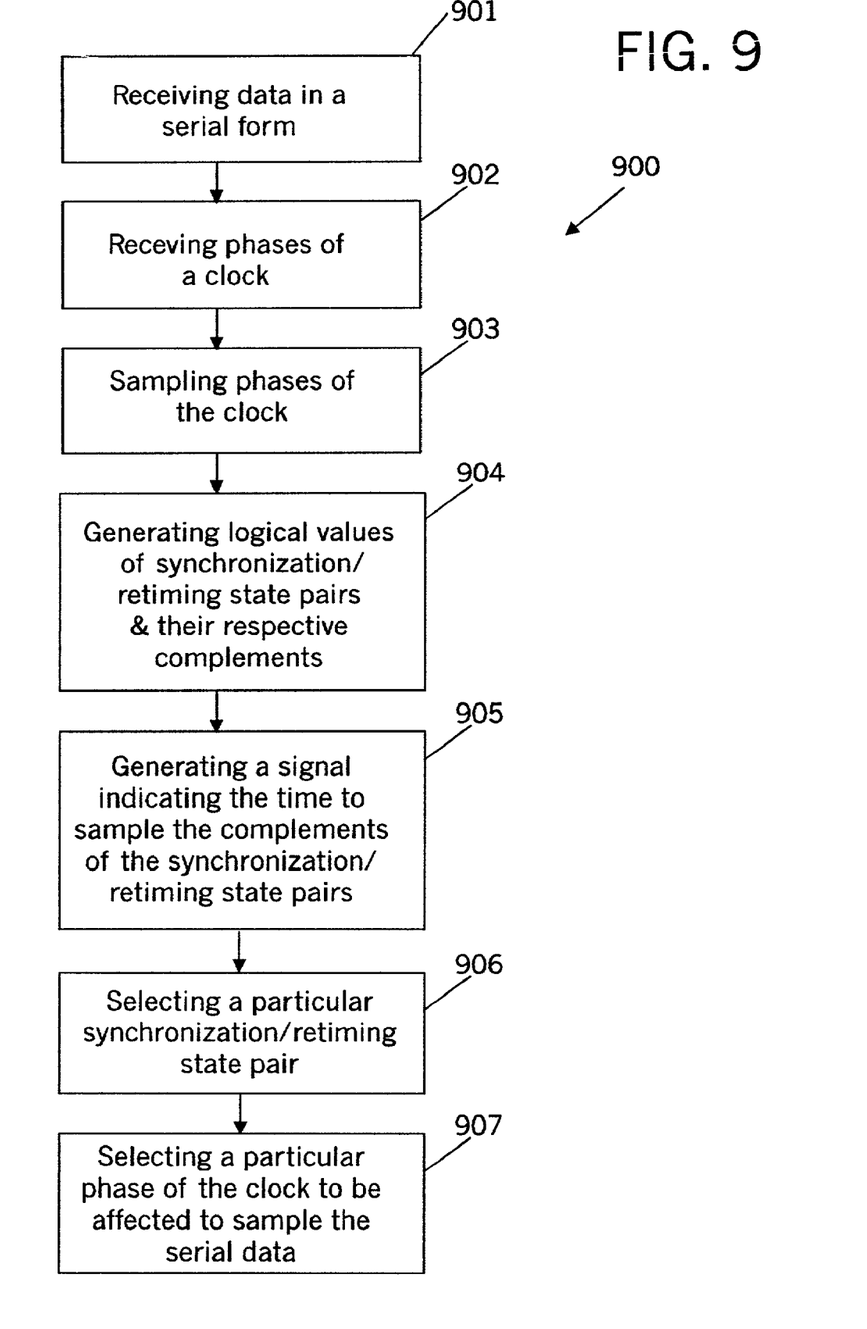
FIG. 9 is a flowchart of a method for reducing timing uncertainties in a serial data signal.

FIG. 9—Method for Reducing Timing Uncertainties in a Serial Data Signal

FIG. 9 illustrates a flowchart of one embodiment of the present invention of a method 900 for reducing timing uncertainties, i.e., jitter, in serial data signal 201. In step 901, receiver 103 (FIG. 1) may comprise a retiming mechanism 205 (FIG. 2) configured to receive serial data 201 transmitted from transmitter 101 (FIG. 1). In step 902, retiming mechanism 205 in receiver 103 may further be configured to receive phases of clock generated from an oscillator 204 (FIG. 2) in receiver 103. It is noted that oscillator 204 may be configured to operate at a frequency lower than the serial data rate thereby saving power. Retiming mechanism 205 may be configured to select a particular phase of the clock generated by oscillator 204 to sample serial data 201 during a period of serial data 201 to reduce timing uncertainties, i.e., jitter, in the serial data signal 201. A retiming state refers to an indication as to which phase of the clock generated by oscillator 204 is the appropriate one to assert to sample the serial data 201 during a particular period of serial data 201 as illustrated in FIG. 3. Each particular retiming state is correlated with a particular synchronization state. A synchronization state refers to an indication as to which phase of the clock generated by oscillator 204 is the appropriate one to assert at a given transition of serial data 201 as illustrated in FIG. 3.

As stated above, retiming mechanism 205 may comprise a synchronization state selector unit 411A (FIG. 4) configured to generate logical values for each synchronization/retiming state pair, e.g., $SS_1RS_4$, $SS_2RS_5$, $SS_3RS_1$, $SS_4RS_2$, $SS_5RS_3$, for each positive edge transition of serial data 201 and a synchronization state selector unit 411B (FIG. 4) configured to generate logical values for each synchronization/retiming state pair, e.g., $SS_1RS_4$, $SS_2RS_5$, $SS_3RS_1$, $SS_4RS_2$, $SS_5RS_3$, for each negative edge transition of serial data 201. Each synchronization state selector unit 411 may comprise a sample clock mechanism 501 (FIG. 5) configured to sample the phases of the clock generated by oscillator 204 in step 903 as described in the description of FIGS. 6A–B.

Sample clock mechanism 501 may output the sampled values of the phases of the clock to synchronization state detectors 502A–E (FIG. 5). Synchronization state detectors 502A–E may be configured to generate logical values of each particular synchronization/retiming state pair, e.g., $SS_1RS_4$, $SS_2RS_5$, $SS_3RS_1$, $SS_4RS_2$, $SS_5RS_3$, and the complement of each particular synchronization/retiming state pair, e.g., $SS_1RS_4$, $SS_2RS_5$, $SS_3RS_1$, $SS_4RS_2$, $SS_5RS_3$, in step 904 as described in the description of FIG. 7.

The complement of the logical values of each particular synchronization/retiming state pair, e.g., $SS_1RS_4$, $SS_2RS_5$, $SS_3RS_1$, $SS_4RS_2$, $SS_5RS_3$, may be inputted to synchronization state detector 503 (FIG. 5). Synchronization state detector 503 may be configured to generate a completion signal indicating the time to sample the inputs to select a particular synchronization/retiming state pair, e.g., $SS_1RS_4$, $SS_2RS_5$, $SS_3RS_1$, $SS_4RS_2$, $SS_5RS_3$, in step 905 as described in the description of FIG. 8. Upon synchronization state detector 503 asserting the completion signal, synchronization state detector 503 may issue a strobe signal to detect which of the input signals has not changed state.

In step 906, a particular synchronization sate/retiming state pair, e.g., $SS_1RS_4$, $SS_2RS_5$, $SS_3RS_1$, $SS_4RS_2$, $SS_5RS_3$, may be selected based on the logical values of the inputs to synchronization state detector 503 as described in the description of FIG. 8. In one embodiment, a multiplexer 504 (FIG. 5) may be configured to output a selected synchronization state/retiming state pair based on the logical values of the inputs to synchronization state detector 503. The one complemented input to synchronization state detector 503 that remains deasserted, i.e., low, corresponds to the particular synchronization state/retiming state asserted.

In step 907, a particular phase of the clock is selected to be asserted to sample serial data 201 during a period of serial data 201 to reduce timing uncertainties in serial data 201 based on the particular synchronization state/retiming state selected.

It is noted that steps 901–907 in method 900 may be executed in a different order than presented and that the order presented in the discussion of FIG. 9 is illustrative. It is further noted that certain steps in steps 901–907, e.g., steps 901 and 902, may occur almost concurrently.

Although the system and method are described in connection with several embodiments, it is not intended to be limited to the specific forms set forth herein, but on the contrary, it is intended to cover such alternatives, modifications, and equivalents, as can be reasonably included within the spirit and scope of the invention as defined by the appended claims. It is noted that the headings are used only for organizational purposes and not meant to limit the scope of the description or claims.

The invention claimed is:

1. A receiver comprising:
   an input configured to receive serial data;
   an oscillator configured to generate phases of a clock; and
   a retiming mechanism configured to receive said serial data and said phases of said clock, wherein said retiming mechanism includes circuitry for reducing timing uncertainties in said serial data by selecting a particular phase of said clock to be asserted to sample said serial data during a period of said serial data, wherein each particular phase of said clock to be asserted to sample said serial data during said period of said serial data corresponds to a particular retiming state, wherein each particular retiming state is paired with a particular synchronization state, wherein said particular synchronization state indicates which particular phase of said clock to assert at a given transition of said serial data.

2. The receiver as recited in claim 1, wherein said retiming mechanism comprises a first unit, wherein said first unit includes circuitry for generating logical values of each particular synchronization state/retiming state pair.

3. The receiver as recited in claim 2, wherein said first unit receives said phases of said clock and said serial data.

4. The receiver as recited in claim 3, wherein said first unit comprises a sample clock mechanism configured to sample values of said phases of said clock.

5. The receiver as recited in claim 4, wherein said first unit comprises a plurality of second units, wherein said sampled phase values are inputted to said plurality of second units, wherein said plurality of second units includes circuitry for generating said logical values of each particular synchronization state/retiming state pair.

6. The receiver as recited in claim 5, wherein said plurality of second units outputs said logical values of each particular synchronization state/retiming state pair to a completion detector, wherein said completion detector includes circuitry for generating a signal indicating a time to sample inputs of said completion detector.

7. The receiver as recited in claim 6, wherein said first unit comprises a third unit configured to detect one of said inputs of said completion detector that has not changed state upon said completion detector generating said signal, wherein said one of said inputs that did not change state corresponds to a particular synchronization state/retiming state pair to be asserted.

8. The receiver as recited in claim 5, wherein each of said plurality of second units comprises circuitry for performing a NOR function on particular sampled phase values.

9. The receiver as recited in claim 6, wherein said completion detector comprises circuitry for performing a NOR function on said logical values of each particular synchronization state/retiming state pair outputted by said plurality of second units.

10. The receiver as recited in claim 1, wherein said oscillator operates at a frequency lower than a data rate of said serial data.

11. A system comprising:
a transmission medium;
a transmitter coupled to said transmission medium, wherein said transmitter is configured to transmit data in a serial form; and
a receiver coupled to said transmission medium, wherein said receiver is configured to receive said serial data, wherein said receiver comprises an oscillator configured to generate phases of a clock, wherein said receiver further comprises a retiming mechanism configured to receive said serial data and said phases of said clock, wherein said retiming mechanism includes circuitry for reducing timing uncertainties in said serial data by selecting a particular chase of said clock to be asserted to sample said serial data during a period of said serial data;
wherein each particular chase of said clock to be asserted to sample said serial data during said period of said serial data corresponds to a particular retiming state;
wherein each particular retiming state is paired with a particular synchronization state, wherein said particular synchronization state indicates which particular phase of said clock to assert at a given transition of said serial data.

12. The system as recited in claim 11, wherein said retiming mechanism comprises a first unit, wherein said first unit includes circuitry for generating logical values of each particular synchronization state/retiming state pair.

13. The system as recited in claim 12, wherein said first unit receives said phases of said clock and said serial data.

14. The system as recited in claim 13, wherein said first unit comprises a sample clock mechanism configured to sample values of said phases of said clock.

15. The system as recited in claim 14, wherein said first unit comprises a plurality of second units, wherein said sampled phase values are inputted to said plurality of second units, wherein said plurality of second units includes circuitry for generating said logical values of each particular synchronization state/retiming state pair.

16. The system as recited in claim 15, wherein said plurality of second units outputs said logical values of each particular synchronization state/retiming state pair to a completion detector, wherein said completion detector includes circuitry for generating a signal indicating a time to sample inputs of said completion detector.

17. The system as recited in claim 16, wherein said first unit comprises a third unit configured to detect one of said inputs of said completion detector that has not changed state upon said completion detector generating said signal, wherein said one of said inputs that did not change state corresponds to a particular synchronization state/retiming state pair to be asserted.

18. The system as recited in claim 15, wherein each of said plurality of second units comprises circuitry for performing a NOR function on particular sampled phase values.

19. The system as recited in claim 16, wherein said completion detector comprises circuitry for performing a NOR function on said logical values of each particular synchronization state/retiming state pair outputted by said plurality of second units.

20. The system as recited in claim 11, wherein said oscillator operates at a frequency lower than a data rate of said serial data.

* * * * *